United States Patent
Steffan et al.

(10) Patent No.: US 6,424,881 B1
(45) Date of Patent: Jul. 23, 2002

(54) COMPUTER GENERATED RECIPE SELECTOR UTILIZING DEFECT FILE INFORMATION

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/404,081

(22) Filed: Sep. 23, 1999

(51) Int. Cl.⁷ .......................... G06F 19/00; H01L 21/66
(52) U.S. Cl. .......................... 700/121; 700/110; 438/14; 438/16
(58) Field of Search .................. 700/104, 108–110, 700/121, 174; 438/14, 16

(56) References Cited

U.S. PATENT DOCUMENTS

| | | | | |
|---|---|---|---|---|
| 5,867,389 A | * | 2/1999 | Hamada et al. | 700/110 |
| 6,000,830 A | * | 12/1999 | Asano et al. | 700/100 |
| 6,041,270 A | * | 3/2000 | Steffan et al. | 438/14 |
| 6,314,379 B1 | * | 11/2001 | Hu et al. | 700/110 |
| 6,320,402 B1 | * | 11/2001 | Phan et al. | 324/158.1 |
| 6,324,298 B1 | * | 11/2001 | O'Dell et al. | 382/149 |
| 6,373,565 B1 | * | 4/2002 | Kafka et al. | 356/237.1 |

* cited by examiner

Primary Examiner—Leo Picard
Assistant Examiner—Elliot Frank
(74) Attorney, Agent, or Firm—H. Donald Nelson

(57) ABSTRACT

A method of manufacturing semiconductor devices wherein a computer generated list of appropriate review recipes for each layer is available to be used by a review station to review defects on each layer. The most appropriate review recipe is used by the review station unless a review station operator selects an alternate review recipe.

3 Claims, 2 Drawing Sheets

COMPUTER GENERATED RECIPE SELECTOR UTILIZING DEFECT FILE INFORMATION

BACKGROUND OF THE INVENTION

1. Field of the Invention

This invention relates generally to a methodology for the rapid and accurate inspection of defects detected during the manufacture of semiconductor wafers. More specifically, this invention relates to a methodology for the automatic selection of the correct review recipe for use by a review station.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also know as die) from each wafer is not 100% because of defects occurring on die during the manufacturing process. The number of good chips obtained from a wafer determines the yield. As can be appreciated, the cost of chips that must be discarded because of a defect must be amortized over the remaining usable chips.

A single semiconductor chip can require numerous process steps such as oxidation, etching, metallization, ion implantation, thermal annealing, and wet chemical cleaning. These are just a few of the many types of process steps involved in the manufacture of a semiconductor chip. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to "kill" a die and decrease the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort and money is being expended by semiconductor manufacturers to capture and classify defects encountered in the manufacture of semiconductor products. Once a defect is detected, properly described, and classified, effort can begin to resolve the cause of the defect and to eliminate the cause of the defect. The biggest problem that faced the semiconductor manufacturers and one of the most difficult to solve was the problem associated with the training and maintenance of a cadre of calibrated human inspectors who can classify all types of defects consistently and without error. This problem was mainly caused by unavoidable human inconsistency and as a solution to this problem; Automatic Defect Classification (ADC) systems were developed.

One such system for automatically classifying defects consists of the following methodological sequence. Gather a defect image from a review station. View the defect image and assign values to elemental descriptor terms called predicates that are general descriptors such as roundness, brightness, color, hue, graininess, etc. Assign a classification code to the defect based upon the values of all the predicates. A typical ADC system could have 40 or more quantifiable qualities and properties that can be predicates. Each predicate can have a specified range of values and a typical predicate can have a value assigned to it between 1 and 256. The range of values that can be assigned to a predicate is arbitrary and can be any range of values. In this example, a value of 1 could indicate that none of the value is present and a value of 256 would indicate that the quality represented by the predicate is ideal. For example, a straight line would have a value of 1 for the predicate indicating roundness, whereas a perfect circle would have a value of 256 for the same predicate. The classification code for each defect is determined by the system from the combination of all the predicate values assigned to the defect. The goal of the ADC system is to be able to uniquely describe all the defect types, in such a manner that a single classification code can be assigned to a defect that has been differentiated from all other types of defects. This is accomplished by a system administrator who trains an artificial intelligence system to recognize various combinations and permutations of the 40 or more predicates to assign the same classification code to the same type of defect. This would result in a highly significant statistical confidence in the probability that the defect, and all other defects of the same type or class, would always be assigned the same classification code by the ADC system.

However, another problem soon emerged. This problem is that the classification codes were tool dependent. The classification codes are determined by predicates, however, the predicates are unique to each tool and the associated ADC system that detects, assigns values to the predicates, and assigns a classification code to each defect. As the manufacturing process becomes more complex, different tools are utilized to detect defects and assign classification codes to the defects. Because the predicates are unique to each tool, the accumulated knowledge in each tool/ADC system is only usable by that tool/ADC system. Each new tool whether it is a new model from the same manufacturer or a new tool from a different manufacturer may have different predicates that need to be calibrated.

Due to color and pattern differences at the various layers in the semiconductor manufacturing process a multiplicity of recipes must be maintained for any inspection tool, either scanning or reviewing tools, corresponding to these various layers and patterns. Generally, in order to uniquely identify layers that will be similar enough to lump together for most of these tools, a device/layer designator has been sufficient. Therefore, a naming convention has been used for scan or review recipes which indicate these parameters. Thus an operator could choose the recipe name that corresponds to a particular lot on hand. As can be appreciated, when more than one or no review recipes fit these criteria a major problem occurs.

With the advent of the ADC system described above and other automating features, such as auto-alignment, in conjunction with the long setup time required for ADC, multiple recipes can exist for a certain device/layer. For example, one may have a completely manual recipe that only loads parameters particular to a singular review station, requiring quite a bit of operator intervention before review can begin. Or one may have an auto-align recipe that loads the wafer, aligns it, and drives to the first defect to be inspected. Another case would be a full ADC recipe that does everything automatically, including classifying the selected defects.

In order for a review station to be effective for review one must have a file from a scan tool containing all of the pertinent information about the wafers, including lot number, layer number, date, device, defect location information, and scan tool. With this information, the review tool should be able to ascertain the "best" recipe to use for a given scan or defect file.

Therefore, what is needed is an engine associated with a review station that gives the review station the ability to automatically select the best and latest recipe for review based on device/layer information contained in the defect file. This will ensure that the review station uses the best (most developed) recipe for any given lot in order that the review station conducts the most accurate review possible.

SUMMARY OF THE INVENTION

According to the present invention, the foregoing and other objects and advantages are achieved by a method of manufacturing a production lot of wafers wherein a computer generated list of appropriate review recipes for each layer is available to be used by a review station to review defects on each layer.

In accordance with an aspect of the present invention, the most appropriate review recipe is used by the review station unless a review station operator selects an alternate review recipe.

In accordance with another aspect of the present invention, a production lot of wafers is processed through a manufacturing process, processing a layer of the production lot of wafers, scanning the layer of a selected wafer for defects and reviewing selected defects from the selected wafer using a review tools using the selected review recipe.

The described method of manufacturing semiconductor wafers ensures that the most appropriate review recipe is used to review the defects on each layer thus ensuring that the most accurate analysis is made for each layer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiments of the present invention that illustrate the best mode presently contemplated by the inventors for practicing the invention.

Figure 1:
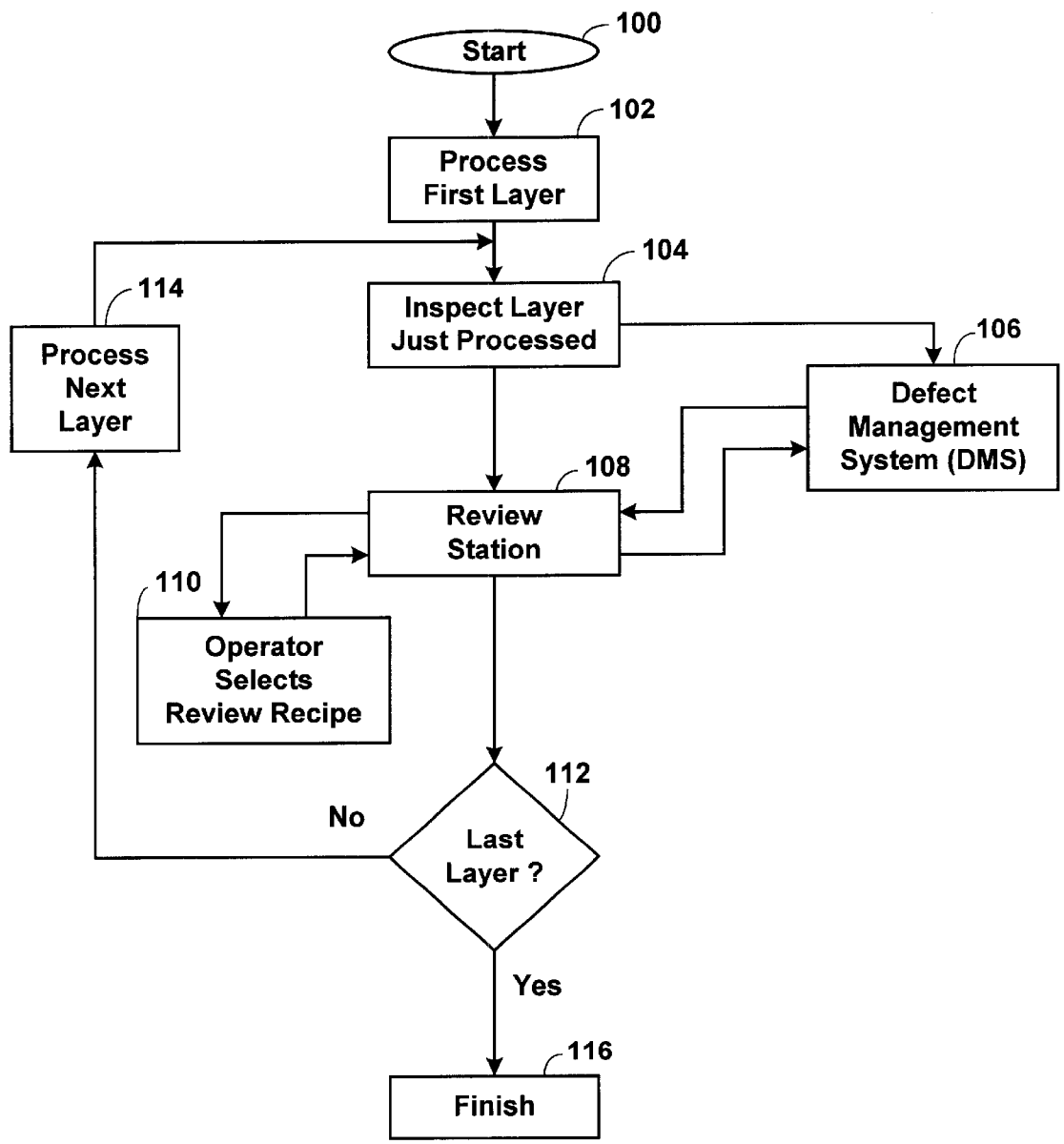
FIG. 1 is a flow diagram describing a prior art method of processing layers of a semiconductor wafer, inspecting each layer for defects and reviewing the detected defects.

FIG. 1 is a flow diagram describing the movement of a selected wafer through all the processes in a current methodology of manufacturing semiconductor devices. As is known in the semiconductor manufacturing art, a production lot of wafers can be any selected number of wafers.

As is also known in the semiconductor manufacturing art, it is not practical to scan each wafer for defects because inspecting each wafer is extremely time consuming, manpower intensive and equipment intensive. Therefore, a small number of wafers are selected from each production lot to be representative of that production lot. In some cases, only one wafer from a production lot is selected to be tested. This wafer is scanned for defects after each manufacturing process that has been designated to be a process that will be tested. It is also noted that the wafer is not scanned after each process because this would also be time consuming, manpower and equipment intensive. It has also been shown that good results can be obtained by scanning the selected wafer only after certain designated processes. The start of the process is indicated at 100. All wafers in the production lot are sent through the first manufacturing process as indicated at 102. After the first process is complete, the selected wafer (or wafers) is (are) examined for defects at 104. The wafers are examined for defects at 104 by one of several scan tools that send defect information to a defect management system 106. The defect management system 106 sends information for selected defects to a review station 108. As is known in the semiconductor manufacturing art, the total number of defects on a layer could be larger than can be practically examined. For this reason, only a selected number of defects may be selected for review. The selected defects are reviewed at 108 after an operator at 110 selects a review recipe for the review station 108 to use for the review of the defects. The selected review recipe must be appropriate for the particular review tool being used, the scan tool that was used to detect the defects, the particular lot, and the particular layer. In addition, the recipe must be the latest recipe developed that includes all the parameters described above. Because of the complexities of the semiconductor devices being manufactured, the increasing number of scan tools and the increasing number review tools, the number of recipes that the operator must choose from can be in the hundreds if not thousands. It has been found that human operators will tend to choose the review recipe that has been used before without investigating other recipes that may have been developed that may be fore appropriate and would provide more accurate data.

After the selected defects have been reviewed on the selected wafers by the review station 108 using the operator selected review recipe, it is determined at 112 if the layer just processed is the last layer. If the layer just process is not the last layer, the next layer is processed at 114 and the next layer just processed is inspected at 104. If it is determined at 112 that the layer just processed is the last layer, the lot of wafers is finished as indicated at 116.

Figure 2:
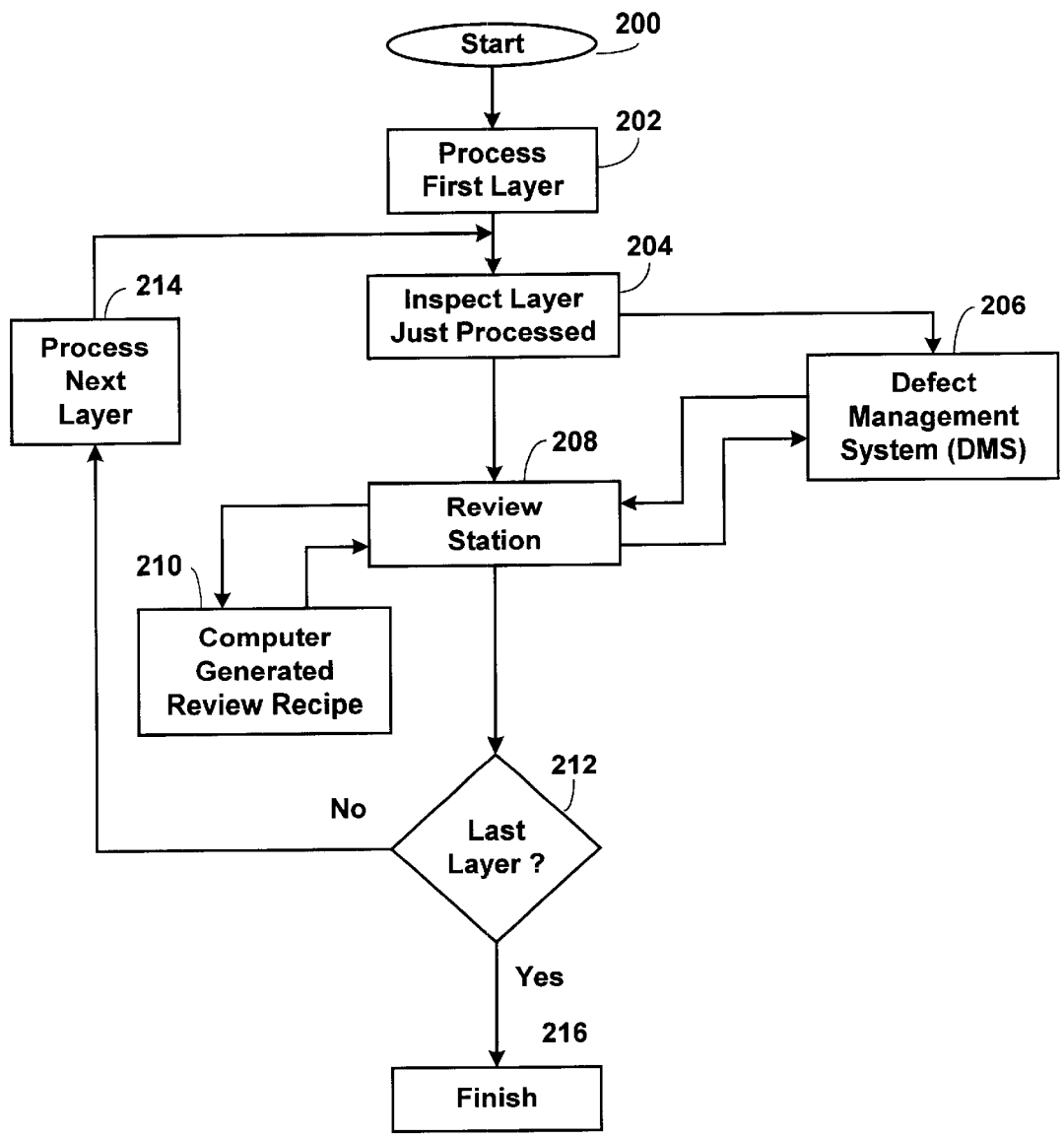
FIG. 2 is a flow diagram describing a method of processing layers of a semiconductor wafer, inspecting each layer for defects and reviewing the detected defects in accordance with the present invention.

FIG. 2 is a flow diagram describing the movement of a selected wafer through all the processes in the manufacture of semiconductor devices in accordance with the present invention. As is known in the semiconductor manufacturing art, a production lot of wafers can be any selected number of wafers. As is also known in the semiconductor manufacturing art, it is not practical to scan each wafer for defects because inspecting each wafer is extremely time consuming, manpower intensive and equipment intensive. Therefore, a small number of wafers are selected from each production lot to be representative of that production lot. In some cases, only one wafer from a production lot is selected to be tested. This wafer is scanned for defects after each manufacturing process that has been designated to be a process that will be tested. It is also noted that the wafer is not scanned after each process because this would also be time consuming, manpower and equipment intensive. It has also been shown that good results can be obtained by scanning the selected wafer only after certain designated processes. The start of the process is indicated at 200. All wafers in the production lot are sent through the first manufacturing process as indicated at 202. After the first process is complete, the selected wafer (or wafers) is (are) examined for defects at 204. The wafers are examined for defects at 204 by one of several scan tools that send defect information to a defect management system 206. The defect management system 206 sends information for selected defects to a review station 208. As is known in the semiconductor manufacturing art, the total number of defects on a layer could be larger than can be practically examined. For this reason, only a selected number of defects may be selected for review. The selected defects are reviewed at 208 after a computer database at 210 selects a review recipe for the review station 208 to use for the review of the defects. The computer derives the appropriate data from the defect file provided by the defect management system regarding the device being manufactured, the layer of the device being manufactured, the technology being used to manufacture the device, and other pertinent information including historical data concerning the same or similar devices. Using a hierarchical structure the computer chooses the most appropriate review recipe available for the desired review and presents the review tool operator with a list including the most appropriate review recipe and all other recipes that are valid for that review in order of appropriateness and validity because the reviewer may want to do a manual review even though a fully automatic review is available. This procedure ensures that the most appropriate review recipe is used in spite of the fact that recipes are in a constant state of flux due to an ever-changing product mix and continuing technology advances. This also ensures that all the heavily developed ADC recipes will be available to be used as soon as they are released. The selected review recipe must be appropriate for the particular review tool being use, the scan tool that was used to detect the defects, the particular lot, and the particular layer. In addition, the recipe must be the latest recipe developed that includes all the parameters described above. Because of the complexities of the semiconductor devices being manufactured, the increasing number of scan tools and the increasing number review tools, the number of recipes that are available for each layer can be in the hundreds if not thousands.

After the selected defects have been reviewed on the selected wafers by the review station 208 using the operator selected review recipe, it is determined at 212 if the layer just processed is the last layer. If the layer just process is not the last layer, the next layer is processed at 214 and the next layer just processed is inspected at 204. If it is determined at 212 that the layer just processed is the last layer, the lot of wafers is finished as indicated at 216.

In summary, the present invention overcomes the limitations of the prior art and fulfills the need for a method of reviewing defects using the most appropriate review recipe available thereby providing the most accurate analysis available.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

sending a production lot of wafers through a manufacturing process;

processing a layer of the production lot of wafers;

selecting at least one wafer from the production lot of wafers;

scanning the layer of the at least one selected wafer from the production lot in a first scan tool to detect if there are defects present on the layer of the at least one selected wafer;

sending defect information for the defects detected on the layer from the scan tool to a defect management system;

sending defect information for the defects detected on the layer to a review station;

sending defect file information for the layer stored in the defect management to the review station; and generating a computer generated list of review recipes for use by the review station, wherein the computer generated list of review recipes are specific to the layer and to the defect and wherein the computer generated list of review recipes includes data regarding the device being manufactured the layer of the device being manufactured, the technology being used to manufacture the device being manufactured and historical data concerning the same device or similar devices.

2. The method of claim 1 wherein the list of review recipes includes all available review recipes for the layer beginning with the most appropriate review recipe for the layer.

3. The method of claim 2 wherein the review station selects the most appropriate review recipe for the layer unless a review station operator chooses an alternate review recipe from the list of review recipes.

* * * * *